United States Patent [19]
Nakamura

[11] Patent Number: 6,066,867
[45] Date of Patent: May 23, 2000

[54] CURRENT CONTROL FUNCTIONAL DEVICE

[75] Inventor: Kazuo Nakamura, Tokyo, Japan

[73] Assignee: NEC Corporation, Tokyo, Japan

[21] Appl. No.: 09/272,739

[22] Filed: Mar. 8, 1999

[30] Foreign Application Priority Data

Mar. 9, 1998 [JP] Japan ................................ 10-056316

[51] Int. Cl.[7] ....................................................... G11B 5/39
[52] U.S. Cl. ........................... 257/295; 257/421; 360/113; 365/158
[58] Field of Search ................................. 257/295, 421; 360/113; 365/158

[56] References Cited

U.S. PATENT DOCUMENTS

| | | | |
|---|---|---|---|
| 5,301,079 | 4/1994 | Cain et al. | 360/113 |
| 5,493,467 | 2/1996 | Cain et al. | 360/113 |
| 5,748,413 | 5/1998 | Lederman et al. | 360/113 |
| 5,862,022 | 1/1999 | Noguchi et al. | 360/113 |
| 5,959,810 | 9/1999 | Kakihara et al. | 360/113 |

OTHER PUBLICATIONS

Yousuke et al, Spin–Valve Memory Elements Using [(Co–Pt/Cu/Ni–Fe–Co)] Multilayers, Jpn J. Appl. Phys. vol. 34 (1995) pp. L415–L417.

Johnson, M., Spin injection in Metal films: the bipolar spin transistor, Materials Science and Engineering, B31, (1995) pp. 199–205.

Primary Examiner—Donald L. Monin, Jr.
Attorney, Agent, or Firm—Hayes, Soloway, Hennessey, Grossman & Hage, PC

[57] ABSTRACT

In a functional device having a substrate, source and drain regions are formed on the substrate. Each of them includes first electric charge carriers. Each of the first electric charge carriers has the substantially same first spin direction which is fixed to a predetermined direction. An intermediate region is formed between the source and drain regions and includes second electric charge carriers. Each of the second electric charge carries has a second spin direction which is variable. A current line is formed over the intermediate region and applies an external magnetic field to the intermediate region. The second direction is determined in dependency upon the application of the external magnetic filed.

22 Claims, 11 Drawing Sheets

CURRENT CONTROL FUNCTIONAL DEVICE

BACKGROUND OF THIS INVENTION

This invention relates to a current control functional device, and in particular, to a functional device which is capable of using as a basic cell of a logic gate or a memory and which utilizes degree of freedom regarding spin of an electric charge carrier.

A limitation with respect to operation speed or integration has been pointed out in a logic gate or a memory which is composed of a silicon bipolar or CMOS (Complementary Metal Oxide Semiconductor). Under this circumstance, it has been expected to realize a new device which utilizes new operation principle exceeding the limitation of the above-mentioned device.

To this end, a new trial has been made about a device which uses degree of freedom of electron spin. A spin injection type transistor has been so far reported in Material Science and Engineering B31, pp. 199–205 (1995) by M. Johnson as the device which utilizes the degree of freedom of the spin.

Further, a memory cell using ferromagnetic substance laminate structure of spin-valve type has been also reported in Japanese journal of Applied Physics 34, L415–417 (1995) by Y. Irie. et al.

Recently, attention has been paid for a single electron transistor (SET) as a device having super low power consumption because it is an extreme electron device which is capable of discriminating each electron. Moreover, suggestion has been made about a single electron-tunneling device having degree of freedom of spin.

However, an output signal is small in either one of the above-mentioned conventional spin injection type transistor or the spin-valve type memory cell. Therefore, a device having a larger output signal has been required to improve device characteristic.

Further, although each of these devices may serve as a memory cell, it is unsuitable for a basic logic device because it does not almost have load-driving capability. Namely, an output signal is small, and is inferior in the load-driving capability in the conventional device which utilizes the spin of the electric charge carrier.

Moreover, an electrode, in which spins are completed in only a third electrode of a center, has been used in the conventional device. In the conventional device, the degree of freedom of the spin is introduced into the single electron tunnel device. In addition, the degree of freedom of the spin is not effectively used in the conventional device because a normal ferromagnetic substance is used as electrode material.

SUMMARY OF THE INVENTION

It is therefore an object of this invention to provide a current control functional device which is capable of supplying extremely large output signal using spin as compared to the conventional case.

It is another object of this invention to provide a current control functional device which has a large load-driving capability so as to apply for a logic device.

It is still another object of this invention to provide a current control functional device which is capable of realizing a variety of device structures by sufficiently utilizing degree of freedom of spin.

A functional device according to this invention includes source and drain regions which are formed on a substrate. Each of the source and drain includes first electric charge carriers. In this event, each of the first electric charge carriers has the substantially same first spin direction which is fixed to a predetermined direction.

Further, an intermediate region is formed between the source and drain regions and includes second electric charge carriers. In this event, each of the second electric charge carries has a second spin direction which is variable.

Moreover, a current line is formed over the intermediate region and applies an external magnetic field to the intermediate region.

With such a structure, the second direction is determined in dependency upon the application of the external magnetic filed.

In this case, each of the source and drain regions and said intermediate regions is formed by a spin polarized material and is structured by a single magnetic domain.

Herein, the first and second electric charge carriers serve for electrical conduction between the source and drain regions and the intermediate region.

In this condition, the functional device is in an off-state when the first direction is different from the second direction. The first direction is different from the second direction when the external magnetic filed is not applied to the intermediate region.

In this event, the first electric charge carriers do not move from the source region into the intermediate region.

On the other hand, the functional device is in an onstate when the first direction is identical with the second direction. The first direction is identical with the second direction when the external magnetic field is applied to the intermediate region. In this case, the first electric charge carriers move from the source region into the intermediate region. Herein, the movement of the first electric charge carriers is carried out by tunneling or injection.

Further, each of the source and drain regions is processed so that shape effect appears. Consequently, the first electrical charge carriers have the substantially same first spin direction.

On the other hand, the intermediate region is processed so that no shape effect appears. In consequence, the second direction is variable and is determined in dependency upon the application of the external magnetic filed on the condition that the first spin direction is fixed.

Moreover, a tunnel barrier is placed between the source and drain regions and the intermediate regions. In this event, the first electric charge carriers move from the source region into the intermediate region via the tunnel barrier.

The above intermediate region may be formed into a nano-meter level in physical size. In this event, the first electrical charge carriers tunnel via the tunnel barrier at every one. Herein, the physical size may be substantially 10 nm or less.

Further, a control electrode is arranged adjacent to the intermediate region and applies a predetermined voltage to the intermediate region in order to control the tunneling of the first electric charge carriers.

Moreover, either one of a ferromagnetic thin-film and an antiferromagnetic thin-film is formed over the intermediate region. Thereby, the second spin direction is kept to the same direction as the first spin direction or the opposite direction against the first spin direction.

Alternatively, either one of a ferromagnetic thin-film and an antiferromagnetic thin-film may be formed under the intermediate region. Consequently, the second spin direction is kept to the same direction as the first spin direction or the opposite direction against the first spin direction.

More specifically, energy bands holding the electric charge carriers having spins of different directions are sufficiently apart from to each other in the source region, the drain region and the intermediate region.

In this event, almost of the electric charge carriers serving for electrical conduction are formed by spin polarized material having the spins of the same directions in at least narrow region. Herein, it is ideal that directions of all spins are completely directed to one direction in the above spin polarized material.

With this structure, the spin directions of the source region and the drain region are directed to the same direction. In this condition, the spin direction of the intermediate region is controlled. Thereby, the spin direction of the intermediate region is identical with the spin direction of the source and drain regions or directed to the opposite direction.

When the electric charge carrier is directed to the spin direction, the electrical charge carrier is readily tunneled or injected from one region to the other region. On the other hand, when the electrical charge carrier is directed to the opposite direction, it is necessary that the electric charge carrier enters into electrically apart spin state so that the electric charge carrier is tunneled or injected. However, this phenomenon does not substantially take place because the probability is extremely low.

In the functional device of this invention, the source and drain regions are processed to control the above spin state so that the shape effect appears. Thereby, the spins are completed in one direction.

On the other hand, the intermediate region between the source and drain regions is processed so that the shape effect does not appear. Consequently, the spin direction of the intermediate region can be changed by the external magnetic filed without giving affect for the spin direction of the source and drain regions.

With such a structure, when the spin direction of the intermediate region is identical with the spin direction of the source and drain region, large flow of the electric charge carriers brings about. In the opposite case, the electric charge carriers can not almost enter from the source region to the intermediate region or from the intermediate region to the drain region.

Further, the spin of the intermediate region can be directed to the opposite direction for the spin direction of the source and drain regions by arranging ferromagnetic substance or antiferromagnetic substance having the desired strength at the upper layer or the lower layer of the intermediate region when the magnetic filed is not applied for the current line. Thereby, the normally-off functional device of low power consumption type can be realized.

Reversely, the spin direction of the intermediate region can be directed to the same direction with the spin direction of the source and drain regions when the magnetic field is not applied for the current control line. Consequently, the normally-on functional device can be also realized.

Further, affect from the source and drain regions for the spin direction of the intermediate region is just cancelled. Thereby, it is possible that immediately previous current operation of the current line is kept after cutting off the current. In consequence, a functional device having non-volatile memory function can be also realized.

Moreover, the physical size of the intermediate region, which is arranged between the source and drain regions via the tunnel barrier, is set to the nano-meter level. Thereby, the change of the charged energy of the intermediate region occurred by tunneling one electrical charge carrier into the intermediate region becomes larger than temperature fade $K_B T$ ($K_B$: Boltzmann constant, T: absolute temperature) of Fermi-level. Consequently, the coulomb-blockade functions for the conduction of the electrical charge carrier in the on state.

As a result, it is possible that the tunnel of the electric charge carrier to the intermediate region is carried out at every one. Therefore, a variety of device structures can be realized by combining the coulomb-blockade with the blockade due to the spin conversion.

DESCRIPTION OF THE PREFERRED EMBODIMENTS

Subsequently, description will be made about an embodiment of this invention with reference drawings.

As illustrated in FIGS. 1 and 2, an intermediate region 103 is formed between a source region 101 and a drain region 102. Further, a current line 104 for controlling external magnetic field is arranged on the intermediate region 103.

Figure 3A:
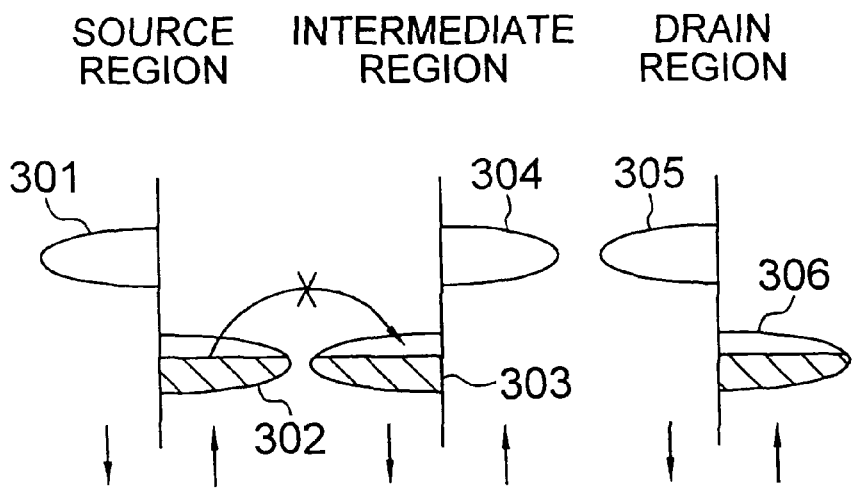
FIGS. 3A and 3B are band diagrams for explaining an operation of a device according to this invention.
Figure 3B:
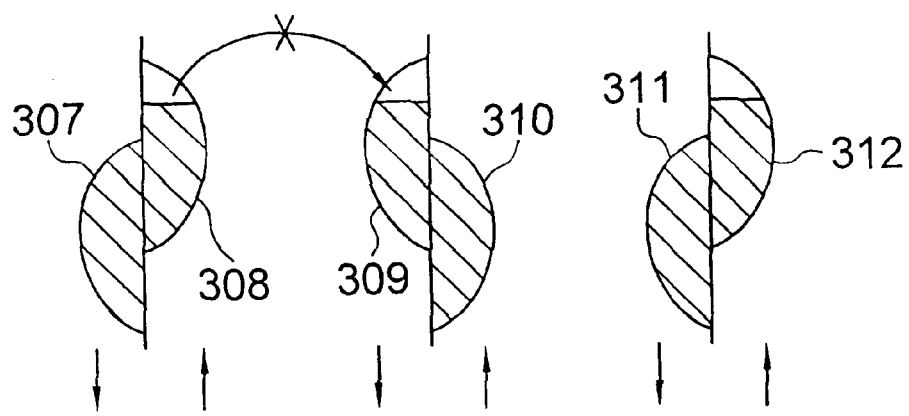

In this case, each region 101–103 is formed by spin polarized material having energy band structure illustrated in FIG. 3 A or FIG. 3B. In this event, it is ideal that the spin-polarized material is a complete spin polarized material.

Further, each region 101–103 is sufficiently small in size so that each region 101–103 is composed of a single magnetic domain. In particular, each of the source and drain regions 101 and 102 is formed into a small and long shape so that all spins of the electric charge carriers in this region are directed to constant direction by the shape effect.

However, it is preferable that the intermediate region 103 is formed into an isotropic shape so that no shape effect appears in the intermediate region 103.

Although the intermediate region 103 is illustrated by a square shape such that space or contact state between the source and drain regions 101, 102 and the intermediate region 103 can be readily recognized in FIGS. 1 and 2, the intermediate region 103 is actually formed into a circular shape.

It is possible that only the direction of the spin in the intermediate region 103 is controlled by applying the external magnetic field from the current line 104 because of the difference of the shape effect between the source and drain region 101, 102 and the intermediate region 103.

Herein, it is to be noted that spaces exist between the source and drain regions 101, 102 and the intermediate region 103 in FIGS. 1A, 1C and FIGS. 2B, 2C. This is because tunnel barriers are arranged in these spaces.

Figure 1A:
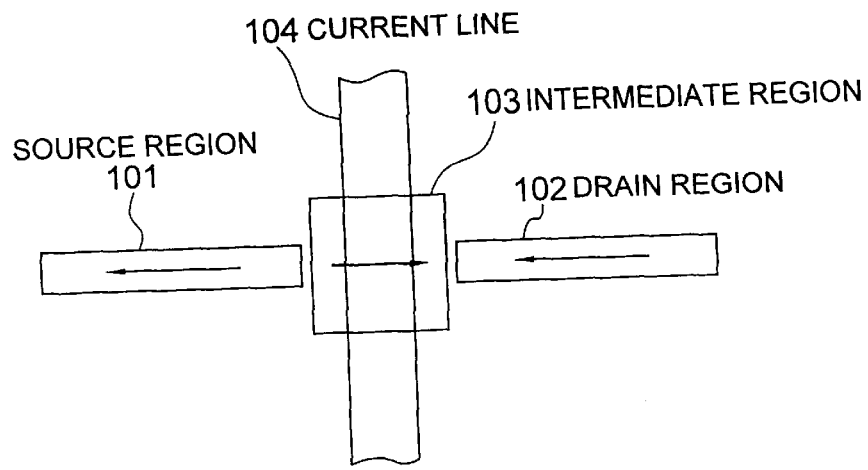
FIGS. 1A through 1C are plane views for explaining an embodiment of this invention.
Figure 1B:
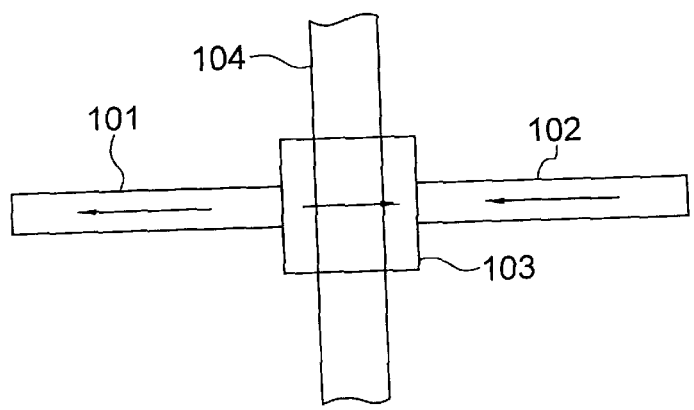
Figure 2A:
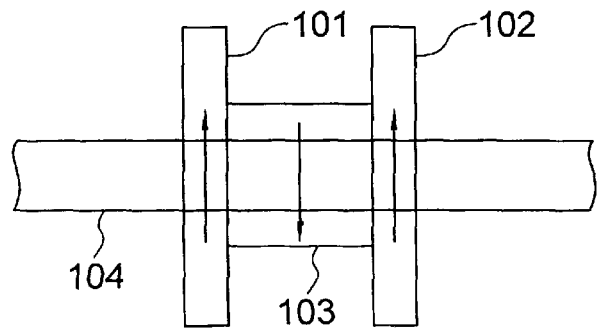
FIGS. 2A through 2C are plane views for explaining an embodiment of this invention.

On the other hand, the tunnel barrier is not interposed in FIGS. 1B and 2A, and the source and drain regions 101 and 102 directly contacts with the intermediate region 103 in FIGS. 1B and 2A.

Further, ferromagnetic substance or antiferromagnetic substance thin-film may be arranged on an upper layer or a lower layer of the intermediate region 103. Consequently, an initial spin of the intermediate region 103 is kept to the same direction as the source and drain region 101, 102 or the opposite direction.

Figure 1C:
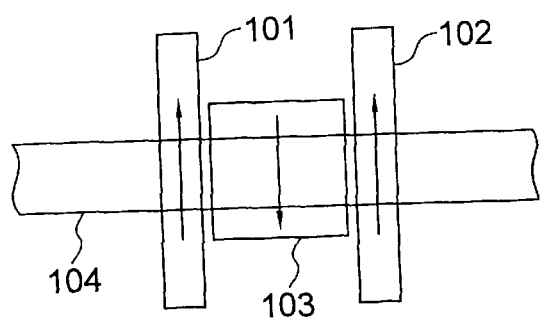

Moreover, the direction of the spin in each source and drain region 101, 102 corresponds to an arranging direction of each source and drain region 101, 102 in FIGS. 1A and 1B. Alternatively, the direction of the spin in each source and drain region 101, 102 may cross with the arranging direction of each source and drain region 101, 102, as illustrated in FIGS. 1C and 2A.

In the latter case, the spins in the source and drain region 101 and 102 are more strongly affected by the current line 104. In consequence, a structure having stronger shape effect is realized.

Figure 2B:
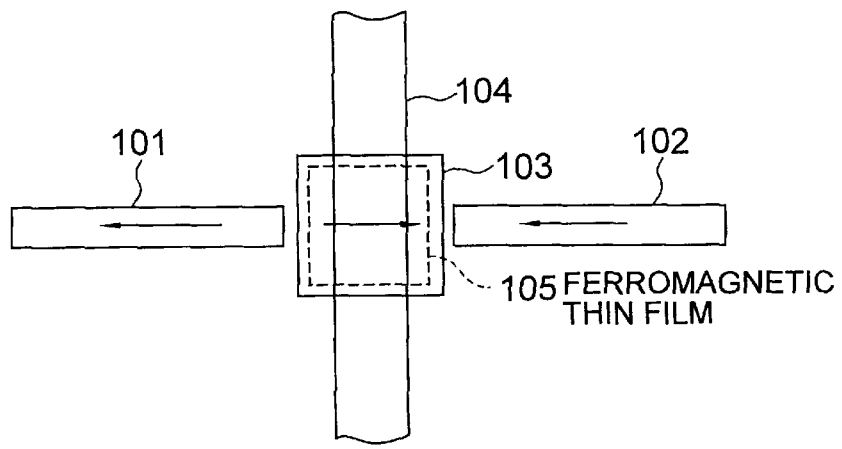
Figure 2C:
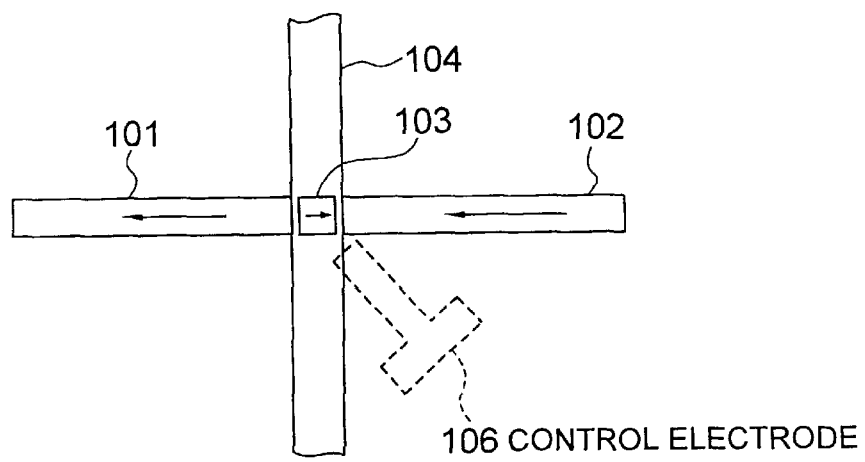

Moreover, when the intermediate region 103 is arranged between the source and drain regions 101 and 102 via the tunnel barrier, a physical size of the intermediate region is set to nano-meter level (about 10 nm or less), as shown in FIG. 2C.

Thereby, the coulomb-blockade functions for conduction of the electrical charge carriers in an on state. In this event, it is desirable that a control electrode 106 for applying a voltage is arranged adjacent to the intermediate region 103.

Subsequently, description will be made about an operation of the above-mentioned device.

In a basic structure illustrated in FIG. 3A, each region is formed by the complete polarized material. In this case, an upper direction spin and a lower direction spin are not overlapped to each other, and are apart with such energy that transfer is not simply carried out between the bands by thermal excitation.

Fermi level exists on the band (302 and 306) of the upper direction spin at the right hand side, and the bands (301 and 305) of the lower direction spin are apart with energy in the source and drain region 101 and 102.

Band diagram (the lower direction band:303, the upper direction band:304) of the spin state of the opposite direction is illustrated in the intermediate region 103 at the center, and the Fermi level exists on the band (303) of the lower direction spin in this region.

Therefore, the electric charge carriers can not enter to the region having different spin, as indicated by the illustrated arrow. When the source and drain regions 101 and 102 contact with the intermediate region 103 directly or via the tunnel barrier, the injection of the electrical charge carriers is inhibited.

In this state, the current which flows along the current line is properly adjusted. Consequently, the magnetic field can be applied so as to reverse only the spin of the intermediate region 103 on the condition that the spins of the source and drain regions 101 and 102, in which the inversion of the spin direction is restricted by the shape effect, are not reversed.

When the spin of the intermediate region 103 is reversed, the band structure of the intermediate region 103 has the same state as the source and drain regions 101 and 102. In consequence, the tunnel or the injection of the electric charge carriers becomes possible. Therefore, it is possible to flexibly control the flow of the electrical charge carriers by switching the current of the current line 104.

Further, the spin of the intermediate region 103 is controlled by arranging ferromagnetic substance (or antiferromagnetic substance) thin-film 105 on the condition that the external magnetic field is not applied by the current line 104, as illustrated in FIG. 2B.

Thereby, when no current flows along the current line 104, the device can be selected to either one of a conduction state (normally-on) and an insulating state (normally-off).

Moreover, affect from the source and drain regions 101 and 102 for the spin direction of the intermediate region 103 is just cancelled by arranging the ferromagnetic substance (or antiferromagnetic substance) thin-film 105. Thereby, it is possible that immediately previous current operation of the current line 104 is kept after cutting off the current.

In consequence, it is possible to control the functional device with low current consumption. In addition, the functional device having non-volatile memory function can be also realized.

Moreover, the physical size of the intermediate region 103 at the center is set to the nano-meter level in the device in which the intermediate region 103 is arranged between the source and drain regions 101 and 102 via the tunnel barrier, as shown in FIG. 2C.

Thereby, the increase of the charged energy of the intermediate region 103 occurred by tunneling one electric charge carrier into the intermediate region 103 in the on state becomes larger than temperature fade $K_B T$ ($K_B$: Boltzmann constant, T: absolute temperature) of Fermi-level.

Consequently, the coulomb-blockade effectively functions. Specifically, the subsequent tunnel of the electric charge carrier is carried out after the electric charge carrier that has initially tunneled further tunnels to the drain side, and the energy band originally returns.

As a result, it is possible that the tunnel of the electric charge carrier to the intermediate region 103 is carried out at every one. Thereby, power consumption can be put into the extreme level. Further, a variety of device structures including many valued logic devices can be realized by combining the coulomb-blockade with the blockade due to the spin conversion.

In this event, the current line 104 is not limited with respect to the arranging position as long as the spin direction of the intermediate region 103 can be controlled. For example, the current line 104 may be arranged on an upper layer or a lower layer of the intermediate region 103.

Although the upper direction spin and the lower direction spin are overlapped to each other in each region in FIG. 3B, each region is formed by the complete spin polarized material. Namely, the Fermi level is positioned as illustrated in FIG. 3B. The electric charge carrier for conduction in the normal temperature region is consisted of the spin of one side direction and is not affected by the spin of the reverse direction.

More specifically, the Fermi-level exists at the band (308 and 312) of the upper direction spin at the right hand side in the source drain regions 101 and 102. Further, the band (308 and 312) of the upper direction spin is overlapped with the band (307 and 311) of the lower direction spin with sufficient energy space.

On the other hand, the Fermi-level exists on the band the lower direction band (309) in the intermediate region 103 at the center, and is overlapped with the band (310) of the upper direction spin with sufficient energy space.

In other words, although the band (307, 310, 311) is overlapped with the band (308, 309, 312), the sufficient energy space exists between the upper end of the band and the Fermi level. The operation is similar to the case of the band structure illustrated in FIG. 3A.

The material, in which the spin directions of the electric charge carriers are almost completed in a constant area, can be used so as to as form the source and drain region 101, 102 and the intermediate region 103. In this event, a metal oxide magnetic substance, such as, $La_{1-x}Sr_xMnO_3$, $Fe_3O_4$, and $CrO_2$, may be used as the above material.

EXAMPLES

Subsequently, description will be made about examples of this invention with reference to drawings.

First Example

Figure 4A:
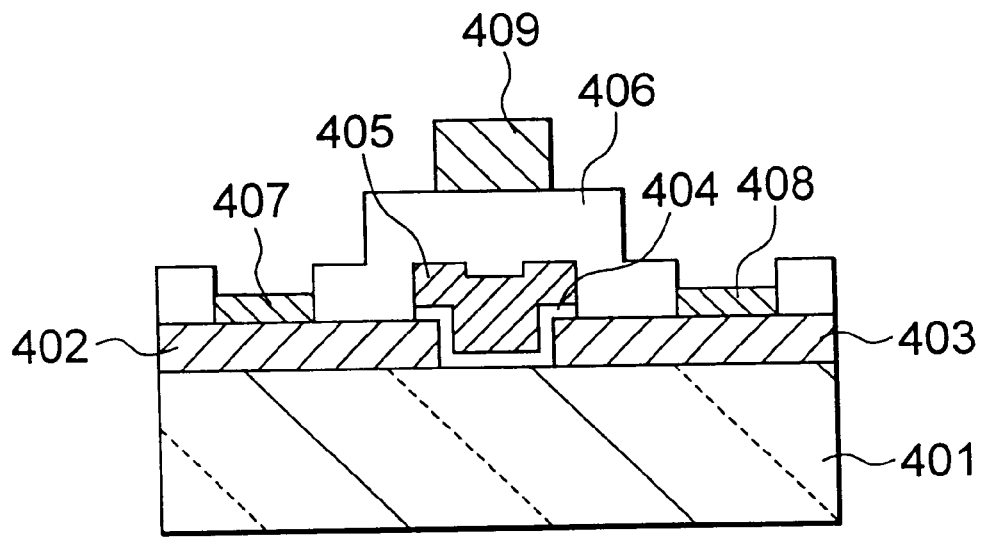
FIG. 4A is a cross sectional view showing a first embodiment of this invention.
Figure 4B:
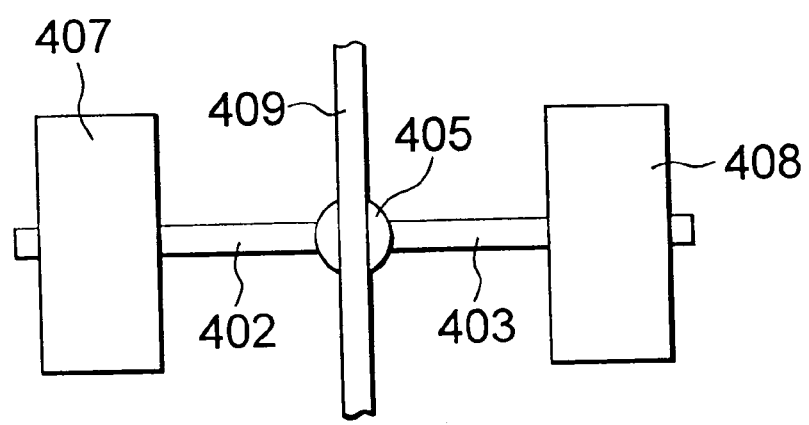
FIG. 4B is a plane view showing a first embodiment of this invention.

Referring to FIGS. 4A and 4B, description will be made about a first example. Herein, a $SiO_2$ film 406 illustrated in FIG. 4A is abbreviated in FIG. 4B.

A source region 402 and a drain region 403 are formed on a $SrTiO_3$ substrate 401. In this event, each of the source and drain regions 402 and 403 is formed by $La_{0.8}Sr_{0.2}MnO_3$, and has a thickness of about 50 nm, a width of about 100 nm, and a length of about 300 nm. Each of the source and drain regions 402 and 403 is composed of a single domain, and the spin directions of the electric charge carriers are identical to each other in both regions 402 and 403.

Further, a cylindrical intermediate region 405 is formed between the source and drain regions 402 and 403 via a tunnel barrier 404 formed by $SrTiO_3$. In this case, the intermediate region 405 is formed by $La_{0.8}Sr_{0.2}MnO_3$, and has a diameter of 150 nm. In this size, the intermediate region 405 can be structured by a single domain.

In this condition, the spin direction of the electric charge carrier in the intermediate region 405 is directed to the opposite for the spin direction of the source and drain regions 402 and 403 in the initial state (the state that the external magnetic field is not applied).

Moreover, the source/drain regions 402, 403 and the intermediate region 405 are covered with the $SiO_2$ film 406. A source electrode 407 and a drain electrode 408 are formed in openings in the $SiO_2$ film 406 on the source and drain regions 402 and 403.

In addition, a current line 409 for controlling the external magnetic field is formed so as to control the spin direction of the electrical charge carrier in the intermediate region 405 via the $SiO_2$ film 406.

Operation of the First Example

As mentioned before, each of the source and drain regions 402 and 403 is processed to the shape having the shape effect while the intermediate region 405 is processed to the shape having no shape effect in the single domain.

In this invention, the complete spin polarized material ($La_{0.8}Sr_{0.2}MnO_3$ in this example) is used in these regions. Consequently, all of the electric charge carriers, which serve for conduction in the source and drain regions 402 and 403, have the spins of the same directions.

Further, the conduction between the source region 402 and the intermediate region 405 and between the intermediate region 405 and the drain region 403 is obtained by the use of the tunneling using $SrTiO_3$ having the thickness of 5–6 nm as a barrier. In this event, the spin direction of the intermediate region 405 decisively becomes important as mentioned above.

In the case of $La_{0.8}Sr_{0.2}MnO_3$, the conduction is carried out by holes, and the band has the state illustrated in FIG. 3A. Further, the energy difference between the upper direction spin and the lower direction spin is equal to about 1 eV.

In consequence, when the spin direction of the intermediate region 405 is opposite to the spin direction of the source and drain regions 402 and 403, the probability for tunneling between the both regions becomes almost zero.

In contrast, when the spin direction of the intermediate region 405 is equal to the spin direction of the source and drain regions 402 and 403, the large tunneling probability can be ensured.

In this example, the current line 409 for controlling the external magnetic field is placed over the intermediate region 405 via the $SiO_2$ film to control the spin direction of the intermediate region 405, as illustrated in FIGS. 4A and 4B.

The spin direction of the intermediate region 405 can be selected to the same direction or the opposite direction for the spin direction of the source and drain regions 402 and 403 in accordance with the direction of the current flowing along the current line 409.

Figure 5A:
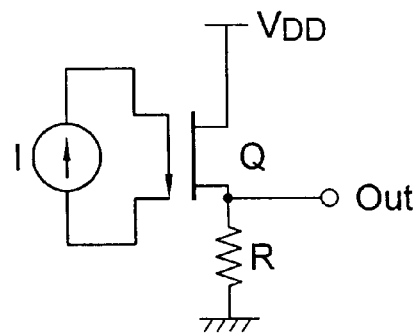
FIG. 5A is a circuit diagram for measuring characteristic of a first embodiment of this invention.

As shown in FIG. 5A, a power supply $V_{DD}$ is connected to the functional device Q, and load resistance R is coupled to the functional device Q. With such a structure, when the current is supplied on the condition that the current direction is switched by a constant current source I for the current line 409, input current waveform and output voltage waveform from an output terminal Out are obtained, as illustrated in FIG. 5B.

When the current (positive current) having the illustrated direction is supplied to the current line 409 from the current source, the spin direction of the intermediate region 405 becomes equal to the spin direction of the source and drain regions 402 and 403. On the other hand, when the negative current is supplied, the spin direction becomes opposite.

Figure 5B:
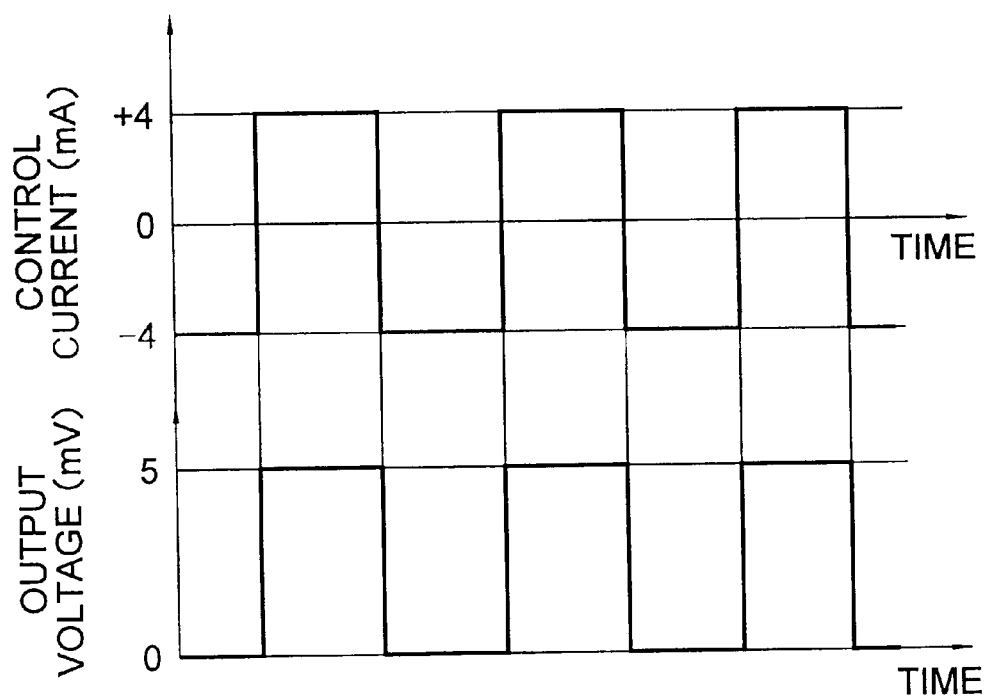
FIG. 5B is time response characteristic diagram of a load output voltage for current of current control line.

Thus, it is found out that the characteristic illustrated in FIG. 5B is obtained. In this case, response rate of the output for the input is high, and the rate of several tens spec or less can be realized.

Manufacturing Method of the First Example

Subsequently, description will be made about manufacturing method of the first example with reference to FIGS. 6A through 6F.

Figure 6A:
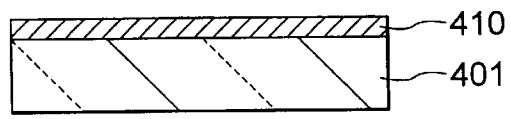
FIGS. 6A through 6F are step sectional views for explaining a manufacturing method according to a first embodiment of this invention.

First, $La_{1-x}Sr_xMnO_3$ is deposited to the film thickness of 50 nm on the $SrTiO_3$ substrate 401 by the use of the laser ablation method using the excimer laser to form the $La_{0.8}Sr_{0.2}MnO_3$ thin-film 410, as shown in FIG. 6A. Herein, $La_{1-x}Sr_xMnO_3$ has composition rate of 0.2 as the complete polarized material.

Figure 6B:
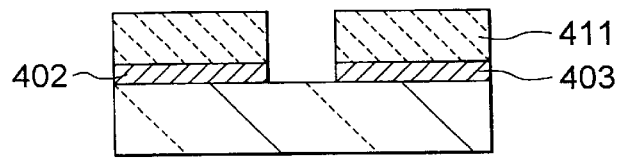

Next, a resist 411 for exposing electron beam using PMMA is coated thereon, and the source and drain regions 402 and 403 are formed by the use of the electron exposure and the argon milling, as illustrated in FIG. 6B.

In this event, the source and drain regions 402 and 403, each of which has the width of about 100 nm and the length of 300 nm, are apart from to each other with about 100 nm. By this process, the source and drain regions 402 and 403 having the single magnetic domain are formed so that the spin directions are equal to each other.

Figure 6C:
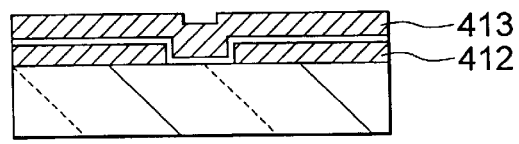

After the resist 411 is removed, the sample is again returned to the laser ablation apparatus. In this condition, the $SrTiO_3$ film 412 is deposited to the film thickness of 5–6 nm, and successively, the $La_{0.8}Sr_{0.2}MnO_3$ film 413 is deposited to the film thickness of about 50 nm, as shown in FIG. 6C.

Figure 6D:
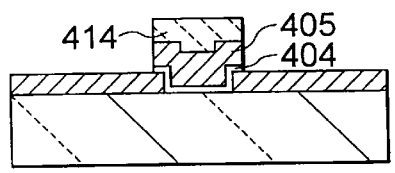

Thereafter, the resist 414 for exposing the electron beam is again coated, and is patterned to the isotropic shape (cylindrical shape having a diameter of about 150 nm in this example) by the use of the electron beam exposure and the development, as shown in FIG. 6D.

Further, the $La_{0.8}Sr_{0.2}MnO_3$ film 413 and the $SrTiO_3$ 412 are patterned by the argon milling to form the tunnel barrier 404 and the intermediate region 405. Herein, the intermediate region 405 is structured by the single magnetic domain by forming with this size.

At this time, terminal detection is accurately performed by monitoring, for example, a Ti signal by the mass spectrograph arranged in the milling apparatus so that the formed source and drain regions 402 and 403 are not ground.

Figure 6E:
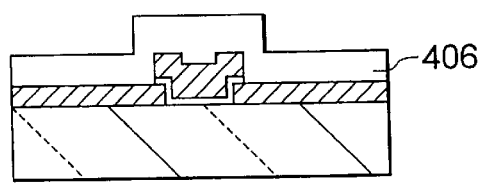

Subsequently, the $SiO_2$ film 406 is deposited thereon, as illustrated in FIG. 6E.

Figure 6F:
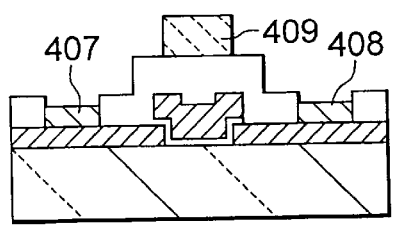
Figure 7A:
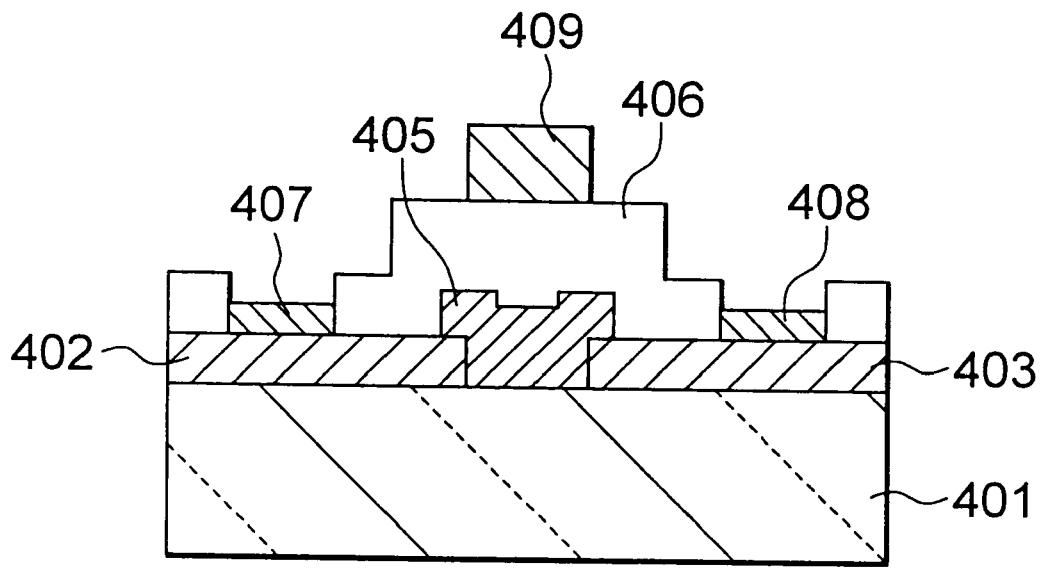
FIG. 7A is a cross sectional view for explaining examples 5 to 7 of this invention.
Figure 7B:
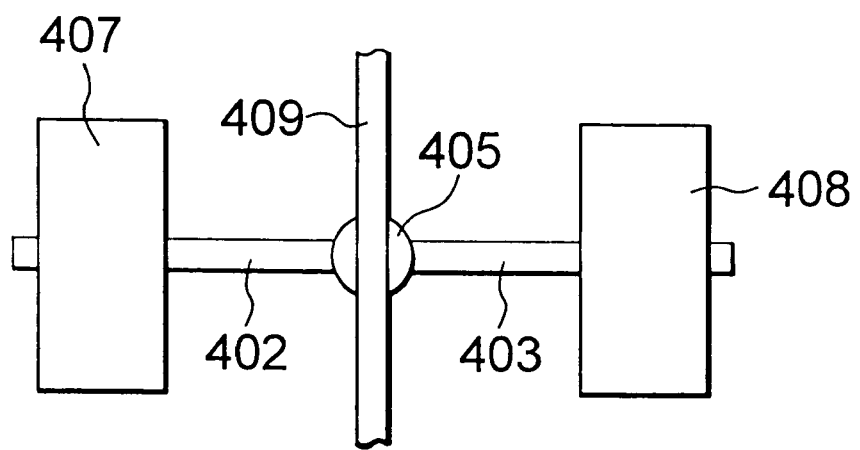
FIG. 7B is a plane view for explaining examples 5 to 7 of this invention.

Successively, gold (Au) is deposited, and is patterned by the known photolithography and the dry etching, as shown in FIG. 6F. Thereby, the current line 409 for controlling the external magnetic field is formed so as to pass over the intermediate region 405.

Finally, openings are formed on the source and drain regions 402 and 403 by the photolithography and the dry etching. Further, gold is deposited, and is patterned by the photolithography to form the source electrode 407 and the drain electrode 408 for the source and drain regions 402 and 403, respectively.

Thus, the functional device of this example illustrated in FIG. 4 is completed. In this event, the current line 409 may be formed simultaneously with the source and drain electrode 407 and 408 by forming the current line 409 after opening the $SiO_2$ film 406.

Second Example

Although the source and drain regions are arranged adjacent to each other at a short side thereof as illustrated in FIG. 1A in the first example, the source and drain regions are arranged adjacent to each other at a long side thereof as shown in FIG. 1C in the second example.

Although the illustration of the second example is abbreviated, the size of the source/drain regions and the distance between them are equal to the first example, and the size and shape of the intermediate region is the same as the first example. Consequently, it is confirmed that the functional device having the same characteristic as the first example can be obtained.

Third Example

The source/drain regions and the intermediate region are formed by the use of $Fe_3O_4$ instead of $La_{0.8}Sr_{0.2}MnO_3$ in the third example. The device structure is abbreviated because it is similar to that in FIG. 4.

$La_{0.8}Sr_{0.2}MnO_3$ has Curie point of about 300 K (relatively low temperature). Therefore, slightly cooling process is required to completely direct all spins towards the same direction. To this end, liquid nitrogen is used for the measurement.

However, $Fe_3O_4$ has high Curie point. In consequence, it is unnecessary to use the liquid nitrogen. As a result, it is confirmed that it is extremely effective for practical use.

Forth Example $CrO_2$ is used as the complete polarized material instead of $La_{0.8}Sr_{0.2}MnO_3$ in the fourth example, and it has been tried to make the structure illustrated in FIG. 4.

Although it is difficult to fabricate the thin-film sample, it is not required to use the liquid nitrogen, and practicability can be confirmed.

Fifth—Seventh Examples

Although the tunnel barrier ($SrTiO_3$) is interposed between the source/drain regions and the intermediate region in the previous examples, this barrier is not used in the fifth—seventh examples, and the source/drain regions directly contacts with the intermediate region on the condition that the shape is the same as the above-mentioned examples.

Thereby, the functional device of the electric charge carrier injection type is made. In this case, $La_{0.8}Sr_{0.2}MnO_3$, $Fe_3O_4$, and $CrO_2$ are used as the material of the source/drain regions and the intermediate region.

In the fifth—seventh examples, when the spins in the off-state are reversed to each other, slight leak current is observed. However, when the spins becomes parallel, the current between the source and drain regions becomes large in comparison with the case of tunneling of the electric charge carrier. Consequently, a large output signal can be obtained.

Eighth Example

Figure 8A:
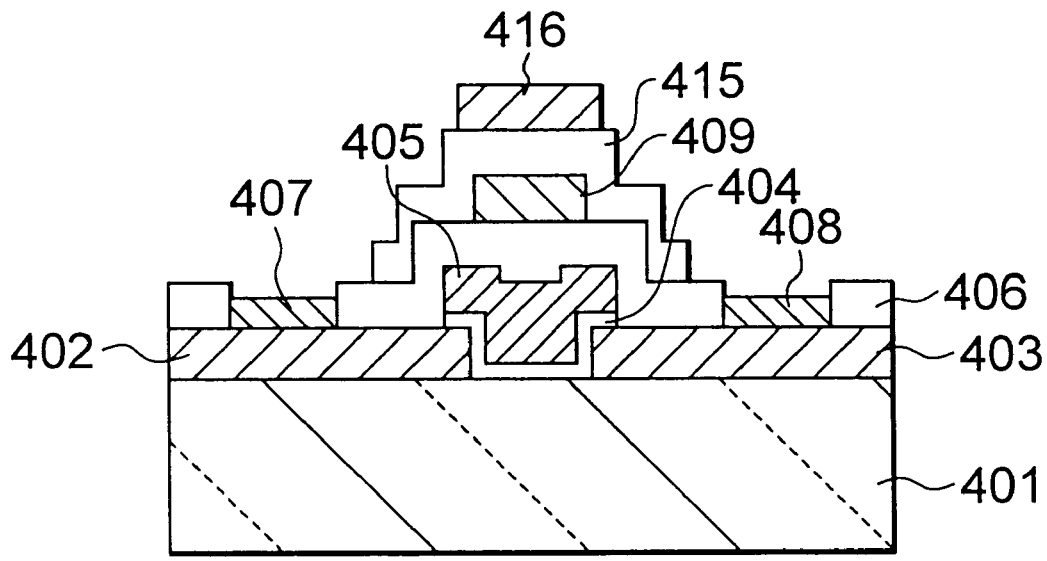
FIG. 8A is a cross sectional view for explaining example 8 to 7 of this invention.
Figure 8B:
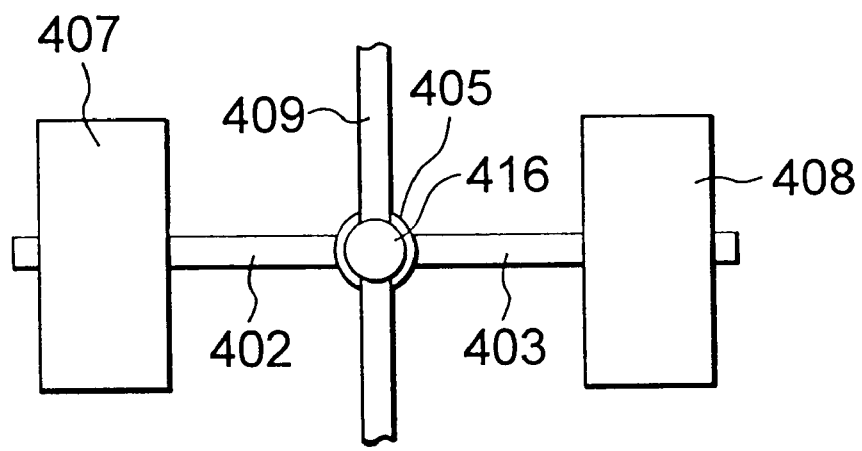
FIG. 8B is a plane view for explaining example 8 of this invention.

In FIG. 8, the same reference numerals are attached to the common portions with the first example illustrated in FIG. 4. Therefore, description of the common portions will be abbreviated in this example.

In this example, a $SiO_2$ film 415 and a ferromagnetic substance thin-film 416 consisting of Fe are added for the first example. Herein, it is to be noted that the $SiO_2$ film 415 and the $SiO_2$ film 406 are abbreviated in FIG. 8B for easy looking.

The strength of the magnetization of the ferromagnetic substance thin-film 416 is adjusted within the range that the intermediate region can just cancel affect given from the source and drain regions in this example. Thereby, the affect of the input current can be kept after cutting off the input current.

It is necessary to satisfy two conditions with respect to the ferromagnetic substance thin-film. Namely, the spin is not reversed by the external magnetic field due to this magnetization as the one condition.

The strength of the initial magnetization is not changed by the magnetic field from the current line 409 as the second condition. These conditions are realized by properly selecting the thickness of the SiO$_2$ film 415 and the strength of the magnetization.

Further, the strength is adjusted so that a trend that the spin of the intermediate region completes to the spin the source and drain regions is just cancels. Further, the spin direction, which is once directed by the signal of the current line, is retained or kept even when the control current becomes zero.

To this end, the thickness of the SiO$_2$ film 415 is selected to 100 nm, and the strength of the magnetization is selected to $3 \times 10^{-6}$ emu ($1.2\pi \times 10^{-9}$ Wb/m$^2$).

Figure 9A:
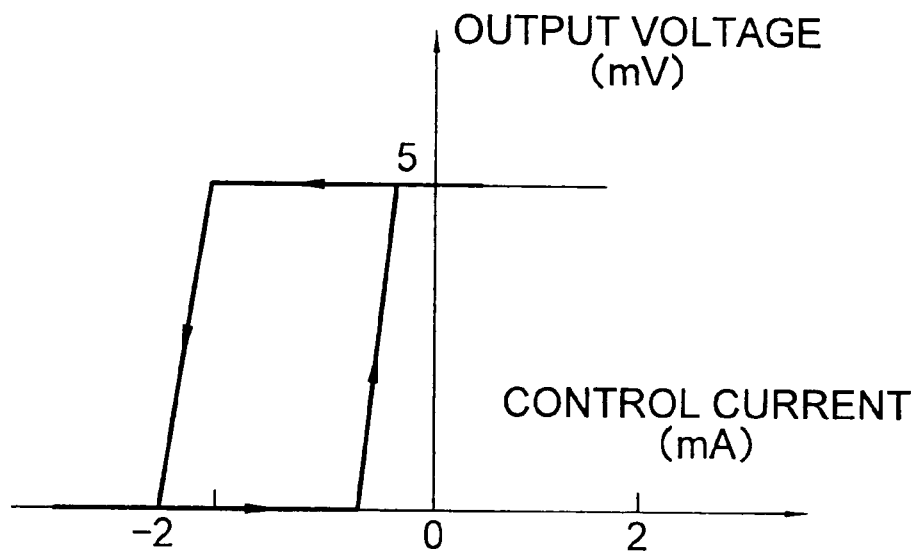
FIG. 9A is a hysteresis characteristic diagram of load output voltage for control current in the example illustrated in FIG. 4.
Figure 9B:
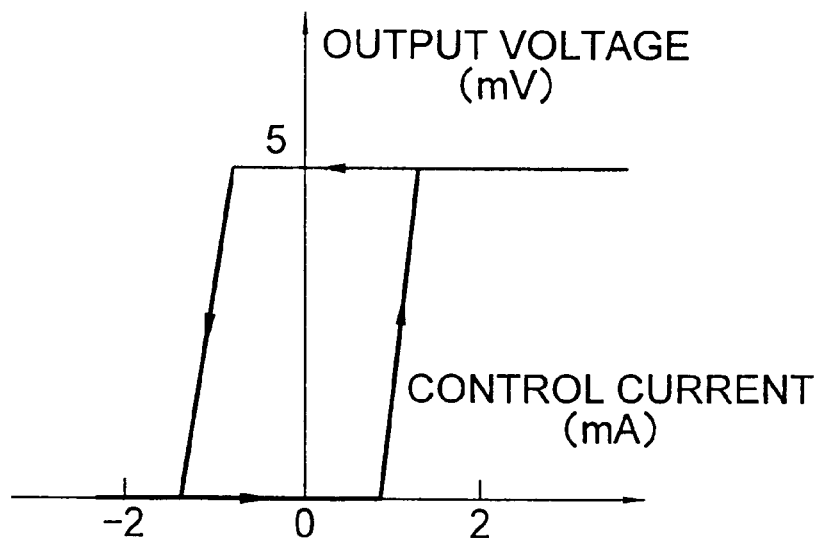
FIG. 9B is a hysteresis characteristic diagram of load output voltage for control current in the example illustrated in FIG. 8.

In the first example in which the ferromagnetic substance thin-film is not used, when the magnetic filed is not applied from the current line, the spins are completed to one side direction, and hysteresis region is deviated to the negative side, as illustrated in FIG. 9A.

In contrast, when the ferromagnetic substance thin-film is used, the hysteresis region just includes input zero state in which no current flows along the current line. This means that the device itself can be used as the non-volatile memory.

Figure 10:
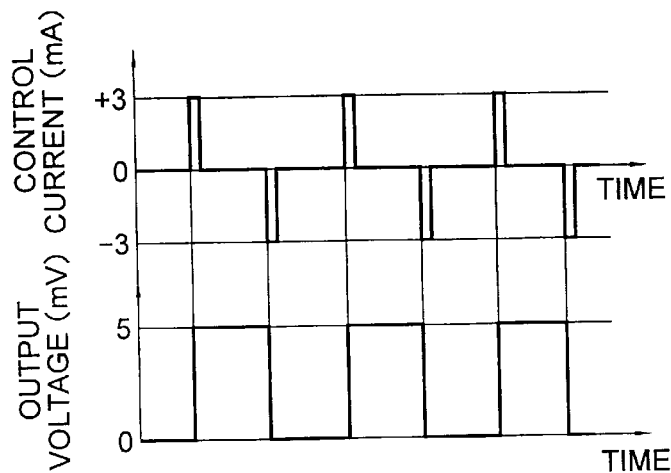
FIG. 10 is time response characteristic diagram of a load output voltage for current of current control line in the example illustrated in FIG. 8.

Further, response characteristic for alternating signals from current line is illustrated in FIG. 10. As shown in FIG. 10, the output characteristic equal to the FIG. 5 can be obtained by the extremely short signal pulse.

In this example, the ferromagnetic substance thin-film 416 is arranged on the device structure in the first example by taking difficulty of the epitaxial growth in the case of performing crystal growth of La$_{0.8}$Sr$_{0.2}$MnO$_3$ on the ferromagnetic substance layer into consideration.

Alternatively, LaMnO$_3$ (antiferromagnetic material) may be arranged under the complete polarized material layer. La$_{0.8}$SrO$_{0.2}$MnO$_3$ can be readily epitaxial-grown on the LaMnO$_3$ layer. Likewise, the antiferromagnetic substance thin-film is formed on the substrate, and the functional device of the above-mentioned other example may be formed thereon.

In this case, the spins of the intermediate region can be completed to the opposite direction against the direction of the surface spins by negative exchange interaction.

Moreover, modification can be added in this eighth example. Namely, the strength of the magnetization of the ferromagnetic substance thin-film 416 may be put into the off state. Specifically, the strength may be adjusted within the range that the spin direction of the intermediate region is opposite to the spin direction of the source and drain region.

In the above-mentioned first—seventh examples, when no current flows along the current line, the spin direction of the electric charge carriers in the intermediate region tends to complete to the spin direction of the source and drain regions. Consequently, it is easy that the on-state appears between the source and drain regions.

When the strength of the magnetization of the ferromagnetic substance thin-film is adjusted in the above-mentioned manner, the functional device of the normally-off type, in which the device is put into the off-state without the input current, can be structured.

Ninth Embodiment

In this example, the coulomb-blockade functions by setting the physical size of the intermediate region to nanometer level.

Figure 11A:
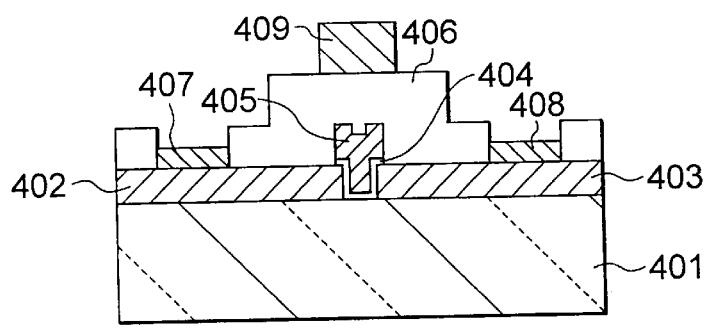
FIG. 11A is a cross sectional view for explaining example 9 of this invention.

In the device illustrated in FIG. 11, the intermediate region in the first example becomes small in size.

Herein, the same reference numerals are attached to the same portions as FIG. 4 in FIG. 11. In this case, the size is not illustrated in proportion to the actual dimension for easy looking in FIG. 11.

The intermediate region 405 is formed to the cylidrical shape having a diameter of about 10 nm, and the coulomb-blockade sufficiently appears in the liquid nitrogen temperature.

Figure 11B:
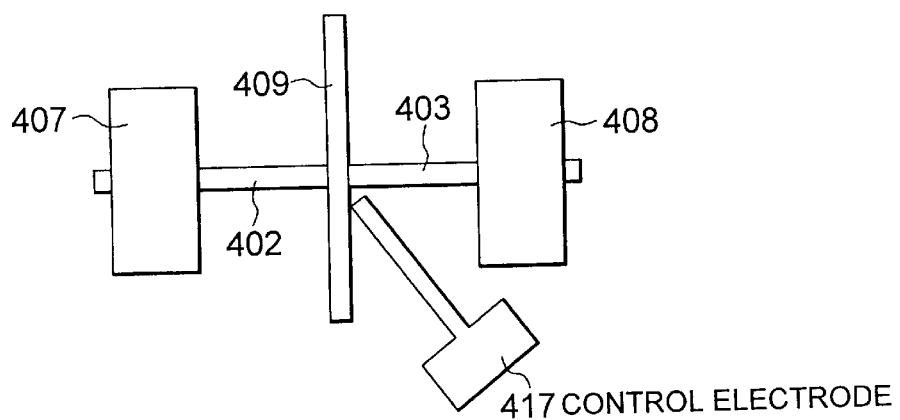
FIG. 11B is a plane view for explaining example 9 of this invention.

In this example, a control electrode 417 for applying the voltage is arranged adjacent to the intermediate region 405 to control the coulomb-blockade, as illustrated in FIG. 11B.

Figure 12:
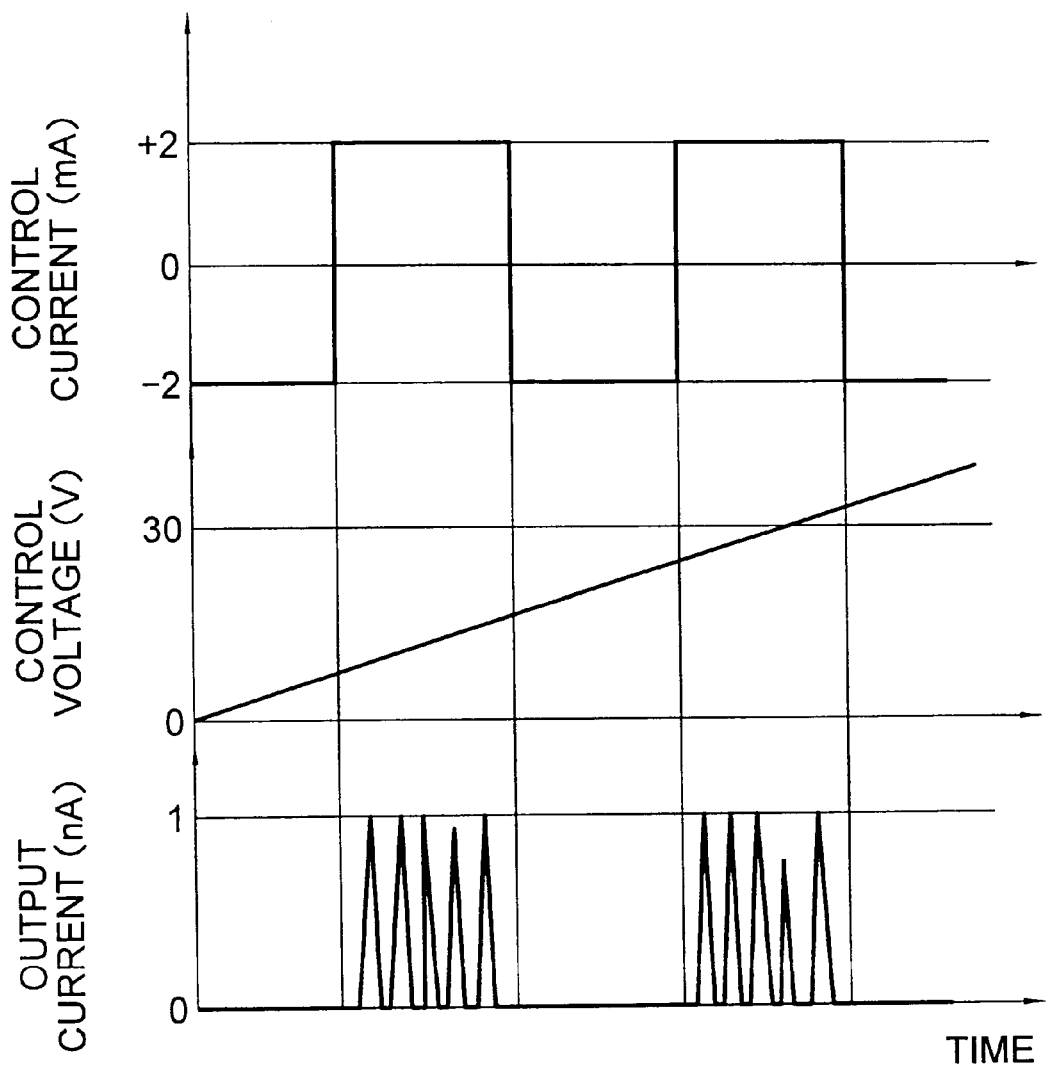
FIG. 12 is dependency characteristic diagram of load output voltage for control voltage and current of control current line in the example 9 of this invention.

The characteristic of the operation of this example is illustrated in FIG. 12. Specifically, the current which flows along the current line 409 and the voltage which is applied to the control electrode 417 are indicated to the vertical axis for the abscissa in FIG. 12. Further, the output current between the source and drain regions is plotted for the control signal at lowest portion in FIG. 12 in the device of this example.

When the control current flows to the positive side, the spin of the intermediate region 405 becomes equal to the spin direction in the source and drain region. In contrast, when the control current flows to the negative side, the spin becomes opposite direction, and the current is blocked by the spin effect other than the coulomb-blockade.

What is claimed is:

1. A functional device having a substrate, comprising:

source and drain regions which are formed on said substrate and each of which includes first electric charge carriers, each of the first electrical charge carriers having the substantially same first spin direction which is fixed to a predetermined direction;

an intermediate region which is formed between said source and drain regions and which includes second electric charge carriers, each of the second electric charge carries having a second spin direction which is variable; and a current line which is formed over said intermediate region and which applies an external magnetic field to said intermediate region;

the second direction being determined in dependency upon the application of the external magnetic filed.

2. A device as claimed in claim 1, wherein:

each of said source and drain regions and said intermediate regions is formed by a spin polarized material and is structured by a single magnetic domain.

3. A device as claimed in claim 2, wherein:

the spin polarized material comprises a metal oxide magnetic substance.

4. A device as claimed in claim 3, wherein:

the metal oxide magnetic substance is at least one selected from the group consisting of $La_{1-x}Sr_xMnO_3$, $Fe_3O_4$, and $CrO_2$.

5. A device as claimed in claim 1, wherein:

the first and second electric charge carriers serve for electrical conduction between said source and drain regions and said intermediate region.

6. A device as claimed in claim 1, wherein:

said device is in an off-state when the first direction is different from the second direction.

7. A device as claimed in claim 6, wherein:

the first direction is different from the second direction when the external magnetic filed is not applied to said intermediate region.

8. A device as claimed in claim 7, wherein:

the first electric charge carriers do not move from said source region into said intermediate region.

9. A device as claimed in claim 1, wherein:

said device is in an on-state when the first direction is identical with the second direction.

10. A device as claimed in claim 9, wherein:

the first direction is identical with the second direction when the external magnetic field is applied to said intermediate region.

11. A device as claimed in claim 10, wherein:

the first electric charge carriers move from said source region into said intermediate region.

12. A device as claimed in claim 11, wherein:

the movement of the first electrical charge carriers is carried out by tunneling or injection.

13. A device as claimed in claim 1, wherein:

each of said source and drain regions is processed so that shape effect appears, whereby, the first electric charge carriers having the substantially same first spin direction.

14. A device as claimed in claim 13, wherein:

said intermediate region is processed so that no shape effect appears, whereby, the second direction being variable and being determined in dependency upon the application of the external magnetic filed on the condition that the first spin direction is fixed.

15. A device as claimed in claim 1, wherein:

a tunnel barrier is placed between said source and drain regions and said intermediate region.

16. A device as claimed in claim 15, wherein:

the first electric charge carriers move from said source region into said intermediate region via said tunnel barrier.

17. A device as claimed in claim 15, wherein:

said tunnel barrier is formed by $SrTiO_3$.

18. A device as claimed in claim 16, wherein:

said intermediate region is formed into a nano-meter level in a physical size, the first electric charge carriers tunneling via said tunnel barrier at every one.

19. A device as claimed in claim 18, wherein:

the physical size is substantially 10 nm or less.

20. A device as claimed in claim 18, further comprising:

a control electrode which is arranged adjacent to said intermediate region and which applies a predetermined voltage to said intermediate region in order to control the tunneling of the first electric charge carriers.

21. A device as claimed in claim 1, wherein:

either one of a ferromagnetic thin-film and an antiferromagnetic thin-film is formed over said intermediate region, whereby, the second spin direction being kept to the same direction as the first spin direction or the opposite direction against the first spin direction.

22. A device as claimed in claim 1, wherein:

either one of a ferromagnetic thin-film and an antiferromagnetic thin-film is formed under said intermediate region, whereby, the second spin direction being kept to the same direction as the first spin direction or the opposite direction against the first spin direction.

* * * * *

UNITED STATES PATENT AND TRADEMARK OFFICE
CERTIFICATE OF CORRECTION

PATENT NO.   : 6,066,867
DATED        : May 23, 2000
INVENTOR(S)  : Nakamura

It is certified that error appears in the above-identified patent and that said Letters Patent is hereby corrected as shown below:

Title page,
Item [57], ABSTRACT, "filed" should be -- field --

Column 2,
Lines 14, 25 and 45, "filed" should be -- field --

Column 3,
Lines 37 and 52, "filed" should be -- filed --

Column 7,
Line 41, "Cr02" should be -- $CrO_2$ --

Column 11,
Line 24, "filed" should be -- field --

Column 12,
Line 59, "filed" should be -- field --

Column 13,
Line 15, "filed" should be -- field --

Column 14,
Line 1, "filed" should be -- field --

Signed and Sealed this

Twenty-third Day of April, 2002

Attest:

*Attesting Officer*

JAMES E. ROGAN
*Director of the United States Patent and Trademark Office*

UNITED STATES PATENT AND TRADEMARK OFFICE
CERTIFICATE OF CORRECTION

PATENT NO. : 6,066,867
DATED : May 23, 2000
INVENTOR(S) : Nakamura

It is certified that error appears in the above-identified patent and that said Letters Patent is hereby corrected as shown below:

<u>Title page,</u>
Item [57], ABSTRACT, "filed" should be -- field --

<u>Column 2,</u>
Lines 14, 25 and 45, "filed" should be -- field --

<u>Column 3,</u>
Lines 37 and 52, "filed" should be -- field --

<u>Column 7,</u>
Line 41, "Cr02" should be -- $CrO_2$ --

<u>Column 11,</u>
Line 24, "filed" should be -- field --

<u>Column 12,</u>
Line 59, "filed" should be -- field --

<u>Column 13,</u>
Line 15, "filed" should be -- field --

<u>Column 14,</u>
Line 1, "filed" should be -- field --

This certificate supersedes Certificate of Correction issued April 23, 2002

Signed and Sealed this

Twenty-seventh Day of August, 2002

*Attest:*

JAMES E. ROGAN
*Attesting Officer*     *Director of the United States Patent and Trademark Office*